United States Patent
Zhu et al.

(10) Patent No.: US 11,404,672 B2
(45) Date of Patent: Aug. 2, 2022

(54) FLEXIBLE DISPLAY PANEL, FLEXIBLE DISPLAY DEVICE, AND MANUFACTURING METHOD THEREOF ENHANCING BENDING ENDURANCE

(71) Applicant: Yungu (Gu'an) Technology Co., Ltd., Langfang (CN)

(72) Inventors: Ping Zhu, Kunshan (CN); Shengfang Liu, Kunshan (CN); Xueyuan Li, Kunshan (CN); Ying Huang, Kunshan (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 213 days.

(21) Appl. No.: 16/861,649

(22) Filed: Apr. 29, 2020

(65) Prior Publication Data

US 2020/0259122 A1 Aug. 13, 2020

Related U.S. Application Data

(63) Continuation of application No. PCT/CN2019/071767, filed on Jan. 15, 2019.

(30) Foreign Application Priority Data

Sep. 30, 2018 (CN) .......................... 201811158207.6

(51) Int. Cl.
  *H01L 51/52* (2006.01)
  *H01L 27/32* (2006.01)
  *H01L 51/56* (2006.01)

(52) U.S. Cl.
  CPC ...... *H01L 51/5256* (2013.01); *H01L 27/3244* (2013.01); *H01L 51/56* (2013.01);
  (Continued)

(58) Field of Classification Search
  None
  See application file for complete search history.

(56) References Cited

U.S. PATENT DOCUMENTS

| 2009/0045485 A1* | 2/2009 | Hirota ................ H01L 28/40 257/E27.113 |
| 2012/0241811 A1 | 9/2012 | Kim et al. |

(Continued)

FOREIGN PATENT DOCUMENTS

| CN | 102097595 A | 6/2011 |
| CN | 104078595 A | 10/2014 |

(Continued)

OTHER PUBLICATIONS

Written Opinion of the International Searching Authority dated Jun. 27, 2019, in corresponding International application No. PCT/CN2019/071767; 7 pages.

(Continued)

*Primary Examiner* — Nduka E Ojeh
(74) *Attorney, Agent, or Firm* — Maier & Maier, PLLC

(57) ABSTRACT

The present disclosure provides a display panel, manufacturing method thereof, and a display device. The display panel includes a substrate, a functional layer formed on the substrate, and an encapsulation layer formed on the functional layer. The encapsulation layer includes an inorganic layer on the functional layer, the inorganic layer includes a first oxide layer and a second oxide layer, and a ratio of the number of atomic layers of the first oxide layer to the number of atomic layers of the second oxide layer ranges from 1:4 to 3:1.

16 Claims, 3 Drawing Sheets

(52) U.S. Cl.
CPC .. *H01L 2227/323* (2013.01); *H01L 2251/303* (2013.01); *H01L 2251/558* (2013.01)

(56) References Cited

U.S. PATENT DOCUMENTS

| | | | | |
|---|---|---|---|---|
| 2013/0146134 | A1* | 6/2013 | Hsiao | H01L 31/022483 257/E31.124 |
| 2016/0093828 | A1* | 3/2016 | Kim | H01L 51/5203 257/40 |

FOREIGN PATENT DOCUMENTS

| | | | | |
|---|---|---|---|---|
| CN | 104518154 | A | | 4/2015 |
| CN | 104518156 | A | | 4/2015 |
| CN | 106450035 | A | * | 2/2017 |
| CN | 106450035 | A | | 2/2017 |
| CN | 106654045 | A | | 5/2017 |
| CN | 106711345 | A | | 5/2017 |
| CN | 107104125 | A | | 8/2017 |
| CN | 107240648 | A | | 10/2017 |
| CN | 107919380 | A | | 4/2018 |
| CN | 108511630 | A | | 9/2018 |
| CN | 108539044 | A | | 9/2018 |

OTHER PUBLICATIONS

Office Action dated May 8, 2020, in corresponding Taiwanese Application No. 108103620; 8 pages.

First Office Action and Search Report dated Jun. 4, 2019, in corresponding Chinese application No. 201811158207.6; 12 pages including Machine-generated Translation.

International Search Report dated Jun. 27, 2019 in corresponding International application No. PCT/CN2019/071767; 4 pages.

Second Office Action and Search Report dated Sep. 11, 2019 in corresponding Chinese application No. 201811158207.6; 13 pages including Machine-generated Translation.

First Office Action dated Oct. 5, 2019 in corresponding Taiwanese application No. 108103620; 10 pages including Partial Machine-generated Translation.

Second Office Action dated Feb. 6, 2020 in corresponding Taiwanese application No. 108103620; 11 pages including Partial Machine-generated Translation.

Rejection of Decision dated Nov. 28, 2019 in corresponding Chinese application No. 201811158207,6; 19 pages including Partial Machine-generated Translation.

* cited by examiner

FLEXIBLE DISPLAY PANEL, FLEXIBLE DISPLAY DEVICE, AND MANUFACTURING METHOD THEREOF ENHANCING BENDING ENDURANCE

CROSS-REFERENCE TO RELATED APPLICATIONS

This disclosure is a continuation application of International Patent Application No. PCT/CN2019/071767, filed on Jan. 15, 2019, which claims priority to Chinese Patent Application No. 2018111582076, titled "DISPLAY PANEL, MANUFACTURING METHOD THEREOF, AND DISPLAY DEVICE", filed on Sep. 30, 2018, the entire content of which is incorporated herein by reference.

TECHNICAL FIELD

The present disclosure relates to a display panel, a manufacturing method thereof, and a display device.

BACKGROUND

Flexible display devices have the bendable or foldable characteristic, and are widely used in many electronic devices such as mobile communication terminals, tablet computers, electronic books, navigation devices, and the like.

In the existing flexible display devices, since the encapsulation layer contains an inorganic layer, the bending endurance of the encapsulation layer is poor, which affects the display effect and the service life of the flexible display devices.

SUMMARY

According to a first aspect of the present disclosure, a display panel is provided. The display panel includes: a substrate, a functional layer and an encapsulation layer. The functional layer is on the substrate. The encapsulation layer on the functional layer. The encapsulation layer includes an inorganic layer on the functional layer. The inorganic layer includes a composite film layer with at least one first oxide layer and at least one second oxide layer. For each of the at least one first oxide layer and each of the at least one second oxide layer, a ratio of the number of atomic layers of the first oxide layer to the number of atomic layers of the second oxide layer ranges from 1:4 to 3:1.

Optionally, the first oxide layer includes at least one of an alumina film layer, a silicon oxide film layer, or a silicon nitride film layer, and the second oxide layer includes a titanium oxide film layer.

Optionally, the at least one first oxide layer includes a plurality of first oxide layers, the at least one second oxide layer includes a plurality of second oxide layers, and the plurality of first oxide layers and the plurality of second oxide layers are alternately stacked.

Optionally, the ratio of the number of atomic layers of the first oxide layer to the number of atomic layers of the second oxide layer ranges from 1:4 to 1:1.

Optionally, the ratio of the number of atomic layers of the first oxide layer to the number of atomic layers of the second oxide layer is 1:3.

Optionally, the first oxide layer has light transmittance greater than that of the second oxide layer.

Optionally, the second oxide layer has bending endurance higher than that of the first oxide layer.

Optionally, a total number of atomic layers of the at least one first oxide layer and the at least one second oxide layer ranges from 100 to 1000.

Optionally, the inorganic layer has a thickness ranging from 20 nm to 100 nm.

Optionally, the composite film layer is made from the at least one first oxide layer and the at least one second oxide layer using an atomic layer deposition process.

Optionally, the encapsulation layer may further include a stacked layer on the inorganic layer, and the stacked layer includes a silicon oxide layer, an organic layer, and a silicon nitride layer.

Optionally, the functional layer includes a thin film transistor layer and an organic light emitting diode layer formed on the thin film transistor layer, the thin film transistor layer have a central region and an marginal region surrounding the central region, the organic light emitting diode layer is located in the central region of the thin film transistor layer, and the inorganic layer covers the marginal region of the thin film transistor layer and the organic light emitting diode layer.

According to a second aspect of embodiments of the present disclosure, a method of manufacturing a display panel is provided. The method includes: providing a substrate; forming a functional layer on the substrate; and forming an inorganic layer on the functional layer, where the inorganic layer includes at least one first oxide layer and at least one second oxide layer, for each of the at least one first oxide layer and each of the at least one second oxide layer, a ratio of the number of atomic layers of the first oxide layer to the number of atomic layers of the second oxide layer ranges from 1:4 to 3:1.

Optionally, the first oxide layer includes at least one of an alumina film layer, a silicon oxide film layer, or a silicon nitride film layer, and the second oxide layer includes a titanium oxide film layer.

Optionally, forming an inorganic layer on the functional layer includes forming the inorganic layer on the functional layer using an atomic layer deposition process.

Optionally, the at least one first oxide layer comprises a plurality of first oxide layers, and the at least one second oxide layer comprises a plurality of second oxide layers, wherein the method further includes alternately stacking the plurality of first oxide layers and the plurality of second oxide layers.

Optionally, the first oxide layer has optical transmittance greater than that of the second oxide layer, and/or the second oxide layer has bending endurance higher than that of the first oxide layer.

Optionally, the method further includes: the ratio of the number of atomic layers of the first oxide layer to the number of atomic layers of the second oxide layer is set to a range of 1:4 to 1:1.

Optionally, forming a functional layer on the substrate includes: forming a thin film transistor layer on the substrate, where the thin film transistor layer includes a central region and a marginal region surrounding the central region; and forming an organic light emitting diode layer in the central region of the thin film transistor layer, where the inorganic layer covers the marginal region of the thin film transistor layer and the organic light emitting diode layer.

Optionally, the method further includes: forming a stacked layer on the inorganic layer, and the stacked layer and the inorganic layer together serve as an encapsulation layer of the display panel.

According to a third aspect of the embodiments of the present disclosure, there is provided a display device, which includes the display panel described above.

In the display panel, the manufacturing method thereof, and the display device provided by the embodiments of the present disclosure, the inorganic layer on the functional layer includes a first oxide layer and a second oxide layer, and the ratio of the number of atomic layers of the first oxide layer to the number of atomic layers of the second oxide layer ranges from 1:4 to 3:1, which can improve the bending endurance of the display panel while it is ensured that the light transmittance of the display panel meets the requirements, thereby improving the service life and the display effect of the display panel.

The general descriptions above and the detailed description below are merely exemplary and explanatory and are not intended to be limiting the present disclosure.

DETAILED DESCRIPTION

Exemplary embodiments will be described in detail herein, examples of which are shown in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses consistent with aspects related to the disclosure as recited in the appended claims.

The display panel and the method of manufacturing the same in the embodiments of the present disclosure are described in detail below with reference to the accompanying drawings. The features of the embodiments and implementations described below may be complementary to or combined with each other in case of no conflict.

In the embodiments of the present disclosure, for convenience of description, the direction from the substrate toward the functional layer is defined as UP, and the direction from the functional layer toward the substrate is defined as DOWN, so that an up-and-down direction is determined. It is easy to understand that different manners of defining the direction do not affect the actual operation of a process and the actual shape of the product.

Figure 1:
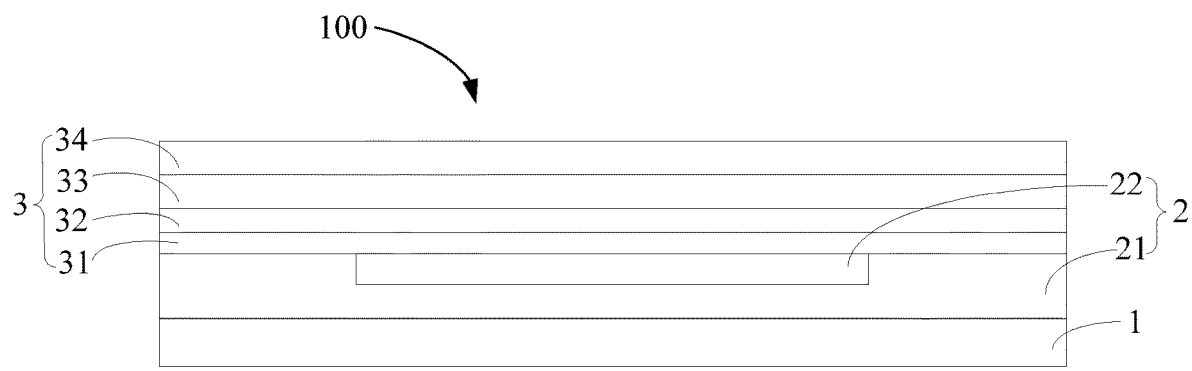
FIG. 1 is a schematic diagram showing a structure of a display panel according to embodiments of the present disclosure.
Figure 2:
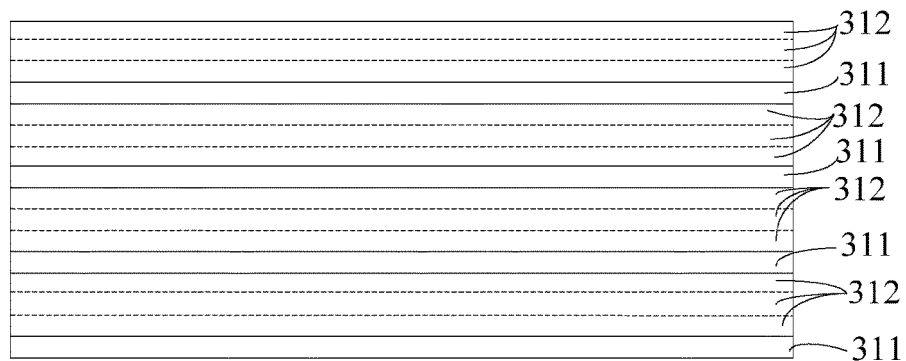
FIG. 2 is a schematic view of a structure of an inorganic layer shown in FIG. 1.

FIG. 1 is a diagram showing a structure of a display panel 100 according to the embodiments of the present disclosure. With reference to FIG. 1, the display panel 100 includes a substrate 1, a functional layer 2, and an encapsulation layer 3. The functional layer 2 is located on the substrate 1. The encapsulation layer 3 is located on the functional layer 2 and includes an inorganic layer 31 located on the functional layer. With further reference to FIG. 2, the inorganic layer 31 includes at least one first oxide layer 311 and at least one second oxide layer 312, and the ratio of the number of atomic layers of the first oxide layer 311 to the number of atomic layers of the second oxide layer 312 ranges from 1:4 to 3:1. For example, the ratio of the number of atomic layers is 2:1, 1:1, or 1:3. As such, the bending endurance of the display panel can be improved while it is ensured that the light transmittance of the display panel meets the requirements, thereby lengthening the service life of the display panel and effectively improving the display effect of the display panel.

That the inorganic layer 31 is located on the functional layer 2 means that the inorganic layer 31 is in contact with an upper surface of the functional layer 2; or, the inorganic layer 31 is over the functional layer 2 without being in direct contact with the upper surface of the functional layer 2.

Optionally, the first oxide layer 311 has light transmittance greater than that of the second oxide layer 312, and/or the second oxide layer 312 has bending endurance higher than that of the first oxide layer 311. When the inorganic layer 31 has the particular number of atomic layers, the light transmittance of the display panel 100 can be improved by increasing the ratio of the number of atomic layers of the first oxide layer 311 to the number of atomic layers of the inorganic layer 31, and the bending endurance of the display panel 100 can be improved by increasing the ratio of the number of atomic layers of the second oxide layer 312 to the number of atomic layers of the inorganic layer 31. When the ratio of the number of atomic layers of the first oxide layer 311 to the number of atomic layers of the second oxide layer 312 ranges from 1:4 to 3:1, the bending endurance of the display panel 100 is improved while it is ensured that the light transmittance of the display panel 100 meets the requirements.

In an embodiment, with reference to FIG. 2 again, the first oxide layers 311 and the second oxide layers 312 are alternately stacked, so that the first oxide layers 311 and the second oxide layers 312 are uniformly distributed in the inorganic layer 31, which is more conducive to optimizing the light transmittance and the bending endurance of the inorganic layer 31.

FIG. 2 is a schematic diagram only showing the alternative stacking of a plurality of first oxide layers 311 and a plurality of second oxide layers 312. Specific arrangement is not limited to that shown in FIG. 2. That the first oxide layers 311 and the second oxide layers 312 are alternately stacked may be implemented in any of the following ways: a first oxide layer 311 with a plurality of atomic layers and a second oxide layer 312 with a plurality of atomic layers are alternately stacked; a first oxide layer 311 with one atomic layer and a second oxide layer 312 with a plurality of atomic layers are alternately stacked; a first oxide layer 311 with one atomic layer and a second oxide layer 312 with one atomic layer are alternately stacked; or, a first oxide layer 311 with a plurality of atomic layers and a second oxide layer 312 with one atomic layer are alternately stacked. When the ratio of the numbers of atomic layers of the first oxide layer 311 to the number of atomic layers of the second oxide layer 312 is less than 1:1, for example, when the ratio is 1:2, it is preferable that a first oxide layer 311 with one atomic layer and a second oxide layer 312 with two atomic layers are alternately stacked.

Optionally, the first oxide layer 311 includes an alumina film layer, and the second oxide layer 312 includes a titanium oxide film layer. In other embodiments, the first oxide layer 311 may also include other oxide film layers, such as a silicon oxide film layer, a silicon nitride film layer, and the like. The second oxide layer 312 may also include other types of film layers as long as it has relatively good light transmittance and bending endurance. For example, the bending endurance of the second oxide layer is better than that of the first oxide layer 311. That the first oxide layers 311 and the second oxide layers 312 are alternately stacked may be that one or more kinds of first oxide layers 311 and one or more kinds of second oxide layers 312 are alternately stacked.

Figure 3:
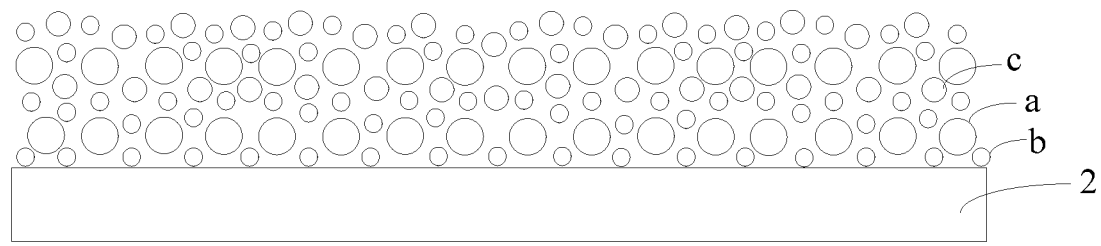
FIG. 3 is a schematic view of an atomic structure of the inorganic layer shown in FIG. 1.

Optionally, the first oxide layer 311 and the second oxide layer 312 can be manufactured by an atomic layer deposition (referred briefly to as ALD) process. The first and second oxide layers manufactured using the ALD process are film layers at atomic layer level. The film layers at atomic layer level have better coverage characteristics for the pores on the surface of underlying film layers, which can reduce the gap between the film layers at atomic layer level and the underlying film layers. In addition, when being formed by using the ALD process, the film layers at atomic layer level are deposited on the underlying film layers in a chemisorption manner. In this way, the adhesive force between the film layers at atomic layer level and the underlying film layers is relatively high, so the adhesive force between the inorganic layer 31 and the functional layer 2 located beneath the inorganic layer is relatively high, which may effectively improve the encapsulation effect of the display panel 100. FIG. 3 is a schematic diagram of an alumina film layer and a titanium oxide film layer formed using the ALD process, in which atom a is a titanium atom, atom b is an oxygen atom, and atom c is an aluminum atom.

When the inorganic layer 31 is manufactured using the ALD process, the number of atomic layers of both the first oxide layer 311 and the second oxide layer 312, as well as the ratio of the number of atomic layers of the first oxide layer 311 to the number of atomic layers of the second oxide layer 312 can be controlled more accurately by controlling the number of pulses and a proportion of the number of pulses of precursors. For example, during the manufacture of the inorganic layer 31, the number of pulses of the precursor of the first oxide layer 311 is 50, and the number of pulses of the precursor of the second oxide layer 312 is 150. In other words, the ratio of the number of pulses of the precursor of the first oxide layer 311 to the number of pulses of the precursor of the second oxide layer 312 is 1:3. In this case, when the total number of atomic layers of the formed inorganic layer 31 is 200, the ratio of the number of atomic layers of the first oxide layer 311 to the number of atomic layers of the second oxide layer 312 in the inorganic layer 31 is 1:3.

Specifically, when the first oxide layer 311 of the inorganic layer 31 is the alumina film layer and the second oxide layer 312 is the titanium oxide film layer, the ratio of the number of atomic layers of the alumina film layer to the number of atomic layers of the titanium oxide film layer is to be adjusted when manufacturing the inorganic layer. For example, the ratio of the number of atomic layers of the alumina film layer to the number of atomic layers of the titanium oxide film layer is adjusted to 1:3, so as to enable the light transmittance and the bending endurance of the display panel 100 both to meet the requirements.

Figure 4:
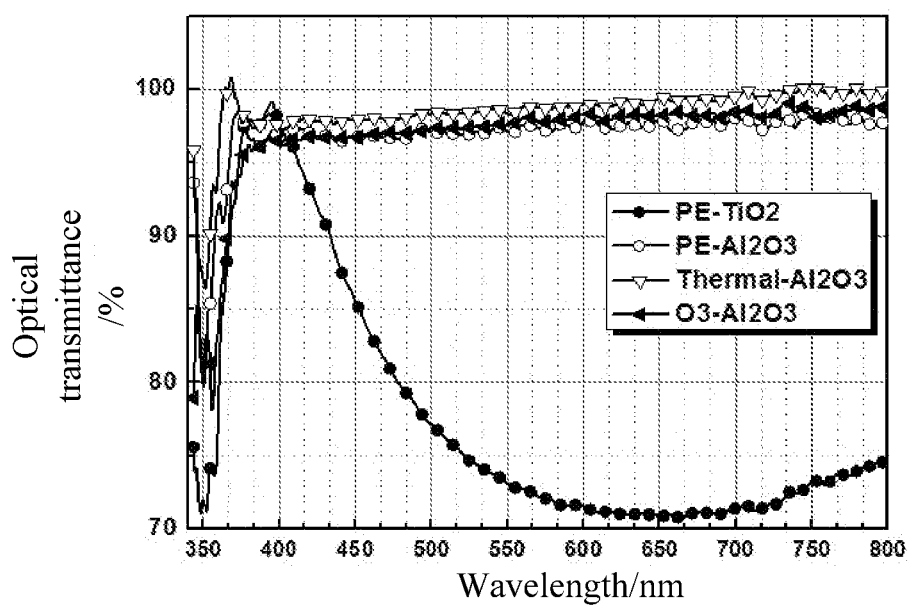
FIG. 4 is a diagram showing light transmittance of different oxide film layers.

There is a certain difference between the light transmittance of both the alumina film layer and the titanium oxide film layer. A test of light transmittance is performed on three alumina film layers manufactured using, respectively, a plasma enhanced atomic layer deposition (referred briefly to as PE-ALD) process, a thermal atomic layer deposition (referred briefly to as thermal-ALD) process and an ozone as oxidizing cursor based ALD (referred briefly to as $O_3$-ALD) process, and on the titanium oxide film layer manufactured using the PE-ALD process. Each of these four oxide film layers includes a plurality of atomic layers. Test results are shown in FIG. 4, where PE-$Al_2O_3$ refers to the alumina film layer manufactured using the PE-ALD process, thermal-$Al_2O_3$ refers to the alumina film layer manufactured using the thermal-ALD process, $O_3$—$Al_2O_3$ refers to the alumina film layer manufactured using the $O_3$-ALD process, and PE-$TiO_2$ refers to the titanium oxide film layer manufactured using the PE-ALD process. As can be seen from FIG. 4, when the wavelength of the light is within the range of 380 nm to 760 nm, the light transmittance of the three alumina film layers are all greater than 97%, and the light transmittance of the titanium oxide film layer varies more greatly, with the lowest point being 73%. It can be known that alumina film layers have the better light transmittance than that of titanium oxide film layer. Therefore, in a case where the display panel 100 is ensured to have a better bending endurance, when considering that the display panel has a relatively good light transmittance, the number of atomic layers of the alumina film layers can be adjusted to be larger than that of the titanium oxide film layers. For example, the ratio of number of atomic layers of the alumina film layer to the number of atomic layers of the titanium oxide film layer may be adjusted to 3:1.

A plurality of display panels can be obtained by controlling the ratio of the number of atomic layers of the alumina film layer to the number of atomic layers of the titanium oxide film layer. Tests of light transmittance are respectively performed on the plurality of display panels, and results show that: when the ratio r of the number of atomic layers of the alumina film layer to the number of atomic layers of the titanium oxide film layer is equal to or greater than 1:4, the light transmittance of the display panel is greater than 90%. In practice, in order to ensure a better display performance of the display panel 100, the light transmittance of the display panel 100 needs to be above 90%.

Tests of bending endurance are respectively performed on the plurality of display panels, and results show that: when the ratio r of the number of atomic layers of the alumina film layer to the number of atomic layers of the titanium oxide film layer is greater than 1, the encapsulation effect of the display panel starts to worsen after the display panel is bent 20,000 times; and when the ratio r of the number of atomic layers of the alumina film layer to the number of atomic layers of the titanium oxide film layer is less than or equal to 1, the encapsulation effect of the display panel remains relatively good after the display panel is bent 20,000 times or even 50,000 times.

Considering both the light transmittance and the bending endurance of the display panel, it is preferable that the ratio of the number of atomic layers of the alumina film layer to the number of atomic layers of the titanium oxide film layer in the inorganic layer 31 is within the range of 1:4 to 1:1, within which range the light transmittance and the bending endurance of the display panel can both meet the requirements. When the first oxide layer 311 and the second oxide layer 312 are other oxide film layers, the preferred range of the ratio of the number of atomic layers of the first oxide layer 311 to the number of atomic layers of the second oxide layer 312 may be different from the range of 1:4 to 1:1.

Optionally, the ratio of the number of atomic layers of the first oxide layer 311 to the number of atomic layers of the second oxide layer 312 is 1:3. When the ratio of the number of atomic layers of the first oxide layer 311 to the number of atomic layers of the second oxide layer 312 is 1:3, the display panel can have a relatively good light transmittance and a relatively good bending endurance. For example, when the ratio of the number of atomic layers of the alumina film layer to the number of atomic layers of the titanium oxide film layer in the inorganic layer 31 is 1:3, the light transmittance and the bending endurance of the display panel are relatively good.

Optionally, the total number of atomic layers of the first oxide layer(s) 311 and of the second oxide layer(s) 312 ranges from 100 to 1000. For example, the total number of atomic layers is 200, 300, 500, 800, etc. In this case, the bending endurance and the light transmittance of the display panel 100 can meet the requirements, and the encapsulation performance of the display panel 100 is also relatively good.

Optionally, the inorganic layer 31 has a thickness ranging from 20 nm to 100 nm. For example, the inorganic layer 31 has a thickness of 30 nm, 50 nm, 80 nm, 90 nm, etc. In this case, the bending endurance and the light transmittance of the display panel 100 can meet the requirements, and the encapsulation performance of the display panel 100 is also relatively good.

Optionally, with reference to FIG. 1 again, the encapsulation layer 3 may further include a stacked layer with a plurality of inorganic layers 32 and 34 and an organic layer 33 above the inorganic layer 31. The stacked layer is, for example, a three-layer structure with a silicon oxide layer, an organic layer, and a silicon nitride layer.

Optionally, the functional layer 2 may include a Thin Film Transistor (referred briefly to as TFT) layer 21 and an Organic Light-Emitting Diode (referred briefly to as OLED) layer 22 formed on the TFT layer 21.

The TFT layer 21 may include a gate electrode, a source electrode, a drain electrode, and an uppermost planarization layer. The gate electrode, the source electrode and the drain electrode may be made of a metal or a metal alloy. The planarization layer is provided with a contact hole. The OLED layer 22 may include a first electrode, an organic light emitting layer formed on the first electrode, and a second electrode formed on the organic light emitting layer. The first electrode is electrically connected with the drain electrode of the TFT layer 21 through the contact hole, so that the drain electrode of the TFT layer 21 can drive the organic light-emitting layer of the OLED layer 22 to emit light through the first electrode.

The TFT layer 21 has a central region and a marginal region surrounding the central region. The OLED layer 22 is located in the central region of the TFT layer 21. The inorganic layer 31 of the encapsulation layer 3 covers the marginal region of the TFT layer 21 and the OLED layer 22. An uppermost layer of the marginal region of the TFT layer 21 may be an inorganic layer, an organic layer or a metal layer. The inorganic layer 31 of the encapsulation layer 3 is in contact with the uppermost layer of the marginal region of the TFT layer 21, and the inorganic layer 31 is deposited in the marginal region in the chemisorption manner, so that there is a relatively high adhesive force between the inorganic layer 31 and the marginal region, which can effectively improve the encapsulation effect of the marginal region of the display panel 100.

A test of aging is performed on the display panel 100 provided by the embodiments of the present disclosure and the existing display panel under the conditions of high temperature and high humidity (e.g., 60° C., 90% relative humidity (referred briefly to as RH), where RH refers to moisture content in the air). In the inorganic layer 31 of the display panel 100, for example, the first oxide layer 311 is an alumina film layer, the second oxide layer 312 is a titanium oxide film layer; the alumina film layer and the titanium oxide film layer are manufactured using the ALD process; the ratio of the number of atomic layers of the alumina film layer to the number of atomic layers of the titanium oxide film layer is 1:3, and the total number of atomic layers of the alumina film layer(s) and the titanium oxide film layer(s) is 300. The inorganic layer of the existing display panel is manufactured using a chemical vapor deposition process. After the test of aging, results show that: a relatively obvious encapsulation failure appears in the marginal region of the existing display panel when the test lasts more than 360 hours; whereas there is no encapsulation failure on the display panel 100 provided by the embodiments of the present disclosure when the test lasts 960 hours. Therefore, the encapsulation layer of the display panel 100 provided by the embodiments of the present disclosure has a better encapsulation effect on the functional layer, which can lengthen the service life of the display panel and improve the display effect of the display panel.

Optionally, the substrate 1 may be a flexible substrate, and the display panel 100 may be a flexible display panel.

In the display panel 100 provided by the embodiments of the present disclosure, the inorganic layer 31 of the encapsulation layer 3 includes at least one first oxide layer 311 and at least one second oxide layer 312. When the ratio of the number of atomic layers of the first oxide layer 311 to the number of atomic layers of the second oxide layer 312 ranges from 1:4 to 3:1, the light transmittance of the display panel can meet the requirements and the bending endurance of the display panel is ensured.

The embodiments of the present disclosure further provide a display device, which includes the display panel described above. In one embodiment, the display device further includes a housing, on which the display panel such as a flexible display panel can be secured.

The display device in the embodiments of the present disclosure may be any product or component having a display function, such as an electronic paper, a mobile phone, a tablet computer, a television, a notebook computer, a digital photo frame, a navigator, and the like.

Figure 5:
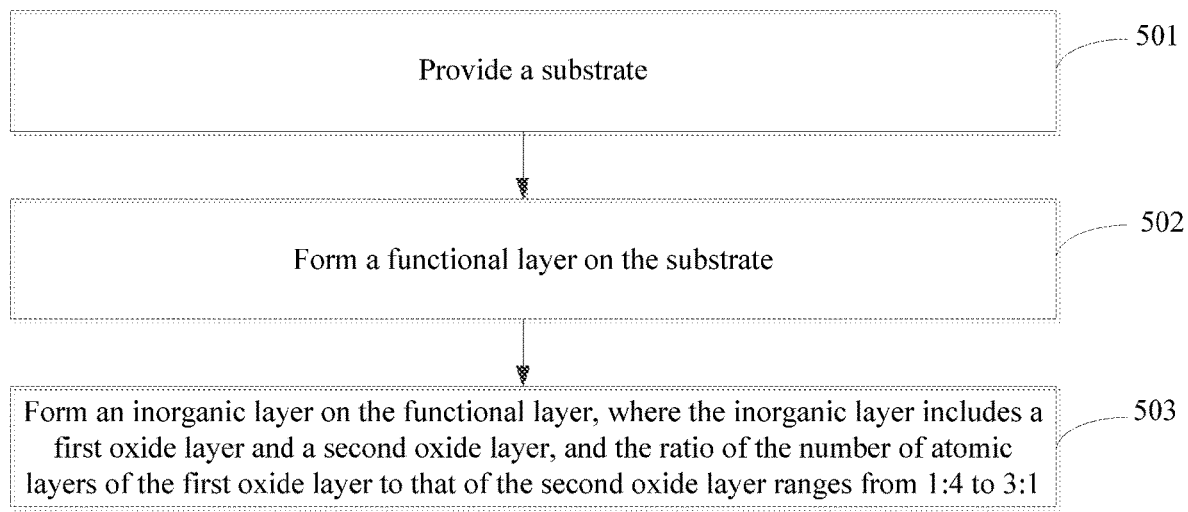
FIG. 5 is a flowchart of a method of manufacturing a display panel according to embodiments of the present disclosure.

FIG. 5 is a flowchart of a method of manufacturing a display panel according to an embodiment of the present disclosure. With reference to FIG. 5, the manufacturing method includes steps 501 to 503.

At step 501, a substrate is provided.

Optionally, the substrate may be a flexible substrate. The flexible substrate may be manufactured by one or more of the following polymers: PEN (polyethylene naphthalate), PET (polyethylene terephthalate), PI (polyimide), PES (polyethersulfone resin), PC (polycarbonate), and PEI (polyetherimide). In other embodiments, the substrate may further include a rigid substrate, and the flexible substrate may be formed by coating the rigid substrate with organic materials. The rigid substrate may be, for example, a glass substrate.

At step 502, a functional layer is formed on the substrate.

Figure 6:
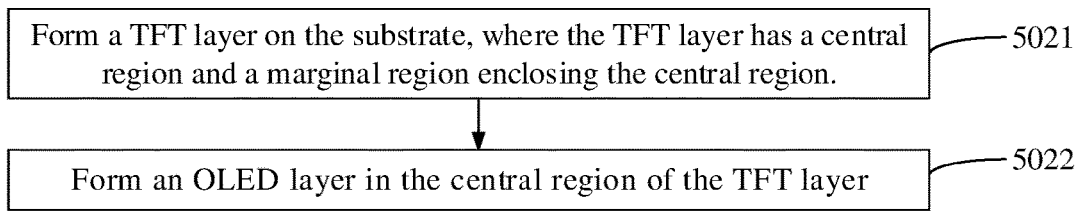
FIG. 6 is a flowchart of a method of manufacturing a functional layer according to embodiments of the present disclosure.

As shown in FIG. 6, step 502 may be implemented by the following steps S021 and S022.

At step 5021, a TFT layer is formed on the substrate, where the TFT layer has a central region and a marginal region surrounding the central region.

The TFT layer may include a gate electrode, a source electrode, a drain electrode, and an uppermost planarization layer. The gate electrode, the source electrode, and the drain electrode serving as components of the thin film transistor are mainly formed in the central region. The planarization layer may be made of an organic insulating material, and a contact hole is provided on the planarization layer. The gate electrode, the source electrode and the drain electrode may be made of a metal or a metal alloy. The marginal region of the TFT layer may be an inorganic layer, an organic layer or a metal layer.

At step 5022, an OLED layer is formed in the central region of the TFT layer.

The OLED layer may include a plurality of pixels, and the plurality of pixels are located in the central region of the TFT layer. Each of the plurality of pixels includes a first electrode, an organic light emitting layer formed on the first electrode, and a second electrode formed on the organic light emitting layer. The first electrode is in contact with the drain electrode through the contact hole of the TFT layer. The first electrode may be formed of a metal or a metal oxide. The second electrode may be formed of a transparent conductive material, such as a metal oxide.

At step 503, an inorganic layer is formed on the functional layer, where the inorganic layer includes a first oxide layer and a second oxide layer, and the ratio of the number of atomic layers of the first oxide layer to the number of atomic layers of the second oxide layer ranges from 1:4 to 3:1.

Furthermore, the ratio of the number of atomic layers of the first oxide layer to the number of atomic layers of the second oxide layer ranges from 1:4 to 1:1. Preferably, the ratio of the number of atomic layers of the first oxide layer to the number of atomic layers of the second oxide layer is 1:3.

Optionally, the first oxide layer has light transmittance greater than that of the second oxide layer, and/or the second oxide layer has bending endurance higher than that of the first oxide layer.

Optionally, the first oxide layers 311 and the second oxide layers 312 are alternately arranged.

Optionally, the first oxide layer and the second oxide layer are formed using the ALD process.

Optionally, the first oxide layer includes an alumina film layer and the second oxide layer includes a titanium oxide film layer.

Optionally, the total number of atomic layers of the first oxide layer(s) and the second oxide layer(s) ranges from 100 to 1000.

Optionally, the inorganic layer has a thickness ranging from 20 nm to 100 nm.

Optionally, after step 503, the manufacturing method further includes: forming a stacked layer with a plurality of inorganic layers and organic layers above the inorganic layer, and the stacked layer and the inorganic layer formed at step 503 together serve as the encapsulation layer of the display panel. The stacked layer may be, for example, a three-layer structure with a silicon oxide layer, an organic layer, and a silicon nitride layer. The inorganic layers in the stacked layer may be formed using physical vapor deposition or chemical vapor deposition, and the organic layer may be formed using organic evaporation.

In the manufacturing method of a display panel provided by the embodiments of the present disclosure, the inorganic layer including a first oxide layer and a second oxide layer is formed on the functional layer. When the ratio of the number of atomic layers of the first oxide layer 311 to the number of atomic layers of the second oxide layer 312 ranges from 1:4 to 3:1, the light transmittance and the bending endurance of the display panel are both relatively good, which lengthens the service life of the display panel and improves the display effect of the display panel.

It is to be noted that in the accompanying drawings, the dimensions of layers and regions may be exaggerated for clarity of illustration. It will be understood that when an element or a layer is referred to as being "above" or "on" another element or layer, it may be directly on the other element, or intervening layers may be present. In addition, it will be understood that when an element or a layer is referred to as being "under" or "below" another element or layer, it may be directly under the other element, or one or more intervening layers or elements may be present. In addition, it will also be understood that when a layer or an element is referred to as being "between" two layers or two elements, it may be the only layer between the two layers or two elements, or one or more intervening layers or elements may be present. Like reference numerals indicate like elements throughout.

In the present disclosure, terms "first" and "second" are used for descriptive purposes only and are not to be construed as indicating or implying a relative importance. The term "a plurality" indicates two or more, unless specifically defined otherwise.

Those skilled in the art will readily conceive other embodiments of the present disclosure upon consideration of the specification and practice of the various embodiments disclosed herein. The disclosure is intended to cover any variations, uses, or adaptations of the present disclosure following general principles of the present disclosure and include the common general knowledge or common technical means in the art without departing from the present disclosure. The specification and examples are indicated by the appended claims.

It is to be understood that the present disclosure is not limited to the precise structures described above and shown in the drawings, and various changes and modifications may be made without departing from the scope thereof. The scope of the present disclosure is limited only by the appended claims.

The invention claimed is:

1. A display panel, comprising:
   a substrate;
   a functional layer disposed on the substrate; and
   an encapsulation layer disposed on the functional layer, wherein the encapsulation layer comprises an inorganic layer disposed on the functional layer, the inorganic layer further comprises a composite film layer having at least one first oxide layer and at least one second oxide layer,
   for each of the at least one first oxide layer and each of the at least one second oxide layer, a ratio of the number of atomic layers of the first oxide layer to the number of atomic layers of the second oxide layer is equal or greater than 1:4 and less than 1:1,
   wherein the at least one first oxide layer and the at least one second oxide layer are provided without an intervening organic layer,
   wherein the at least one first oxide layer comprises a plurality of first oxide layers, the at least one second oxide layer comprises a plurality of second oxide layers, and the plurality of first oxide layers and the plurality of second oxide layers are alternately stacked without the intervening organic layer, wherein a total number of atomic layers of the at least one first oxide layer and the at least one second oxide layer ranges from 100 to 1000, and the inorganic layer has a thickness ranging from 20 nm to 100 nm.

2. The display panel according to claim 1, wherein the first oxide layer comprises at least one of an alumina film layer, a silicon oxide film layer, or a silicon nitride film layer, and the second oxide layer comprises a titanium oxide film layer.

3. The display panel according to claim 1, wherein the ratio of the number of atomic layers of the first oxide layer to the number of atomic layers of the second oxide layer is 1:3.

4. The display panel according to claim 1, wherein the first oxide layer has light transmittance greater than that of the second oxide layer.

5. The display panel according to claim 1, wherein the second oxide layer has bending endurance higher than that of the first oxide layer.

6. The display panel according to claim 1, wherein the composite film layer is made from the at least one first oxide layer and the at least one second oxide layer by an atomic layer deposition process.

7. The display panel according to claim 1, wherein the encapsulation layer further comprises a stacked layer on the inorganic layer, and the stacked layer comprises a silicon oxide layer, an organic layer, and a silicon nitride layer.

8. The display panel according to claim 1, wherein the functional layer comprises a thin film transistor layer and an organic light emitting diode layer formed on the thin film transistor layer, the thin film transistor layer comprises a central region and an marginal region surrounding the central region, the organic light emitting diode layer is located in the central region of the thin film transistor layer, and the inorganic layer covers the marginal region of the thin film transistor layer and the organic light emitting diode layer.

9. A display device comprising the display panel according to claim 1.

10. The display panel according to claim 1, wherein in the inorganic layer, the first oxide layer and the second oxide layer are deposited in a chemisorption manner.

11. A method of manufacturing a display panel, the method comprising:
providing a substrate;
forming a functional layer on the substrate; and
forming an inorganic layer on the functional layer, wherein the inorganic layer further comprises at least one first oxide layer and at least one second oxide layer, for each of the at least one first oxide layer and each of the at least one second oxide layer, a ratio of the number of atomic layers of the first oxide layer to the number of atomic layers of the second oxide layer is equal or greater than 1:4 and less than 1:1, wherein the at least one first oxide layer and the at least one second oxide layer are provided without an intervening organic layer, wherein the at least one first oxide layer comprises a plurality of first oxide layers, and the at least one second oxide layer comprises a plurality of second oxide layers, wherein the method further comprises alternately stacking, without the intervening organic layer, the plurality of first oxide layers and the plurality of second oxide layers, wherein a total number of atomic layers of the at least one first oxide layer and the at least one second oxide layer ranges from 100 to 1000, and the inorganic layer has a thickness ranging from 20 nm to 100 nm.

12. The method according to claim 11, wherein the first oxide layer comprises at least one of an aluminum oxide film layer, a silicon oxide film layer, or a silicon nitride film layer, and the second oxide layer comprises a titanium oxide film layer.

13. The method according to claim 11, wherein forming the inorganic layer on the functional layer comprises forming the inorganic layer on the functional layer by using an atomic layer deposition process.

14. The method according to claim 11, wherein forming the functional layer on the substrate comprises:
forming a thin film transistor layer on the substrate, the thin film transistor layer comprising a central region and a marginal region surrounding the central region; and
forming an organic light emitting diode layer in the central region of the thin film transistor layer,
wherein, the inorganic layer covers the marginal region of the thin film transistor layer and the organic light emitting diode layer.

15. The method according to claim 11, further comprising: forming a stacked layer on the inorganic layer, and the stacked layer and the inorganic layer together serve as an encapsulation layer of the display panel.

16. The method according to claim 11, wherein the inorganic layer is formed by an atomic layer deposition (ALD) process, and the number of atomic layers of both the first oxide layer and the second oxide layer is controlled with the number of pulses of precursors.

* * * * *